(12) United States Patent
Nakata et al.

(10) Patent No.: US 6,788,121 B2
(45) Date of Patent: Sep. 7, 2004

(54) ADIABATIC CHARGING REGISTER CIRCUIT

(75) Inventors: Shunji Nakata, Kanagawa (JP); Yuuichi Kado, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 10 days.

(21) Appl. No.: 09/871,810

(22) Filed: Jun. 4, 2001

(65) Prior Publication Data

US 2002/0000862 A1 Jan. 3, 2002

(30) Foreign Application Priority Data

Jun. 6, 2000   (JP) ........................................ 2000-168846

(51) Int. Cl.⁷ .............................................. H03K 3/037
(52) U.S. Cl. ..................................... 327/199; 327/218
(58) Field of Search ................................ 327/199, 200, 327/201, 203, 208, 218, 291, 295

(56) References Cited

U.S. PATENT DOCUMENTS

| | | | |
|---|---|---|---|
| 5,473,526 A | 12/1995 | Svensson et al. | |
| 5,521,538 A | 5/1996 | Dickinson | 326/93 |
| 5,900,758 A * | 5/1999 | Kanno | 326/28 |
| 5,994,935 A * | 11/1999 | Ueda et al. | 327/202 |
| 6,046,648 A * | 4/2000 | Nakamiya et al. | 331/116 FE |
| 6,313,673 B1 * | 11/2001 | Watanabe | 327/115 |
| 6,323,709 B1 * | 11/2001 | Kulkarni et al. | 326/134 |

FOREIGN PATENT DOCUMENTS

| | | |
|---|---|---|
| JP | 8-335873 | 12/1996 |
| JP | 9-74347 | 3/1997 |
| JP | 10-190442 | 7/1998 |
| JP | 10-308662 | 11/1998 |

OTHER PUBLICATIONS

Athas, William C., "Energy–Recovery CMOS", Low power Design Methodologies, J. M. Rabaey and M. Pedram (Kluwer Academic Publishers, 1996), Chapter 4, pp. 65–72.
Athas, William C. et al., "A Low–Power Microprocessor Based on Resonant Energy", IEEE Journal of Solid–State Circuits, vol. 32, No. 11, Nov. 1997, pp. 1693–1701.
"Low Power and High Speed LSI Technology", Realize Co., along with partial translation of relevant parts, Jan. 31, 1998.
Patterson et al., Structure and Design of a Computer, by David A. Patterson, and John L. Hennessy, published by NikkeiBP, Sep. 22, 1997, p. 677.
Technical Report of Low Power LSI, Nikkei Micro–device, NikkeiBP, 1994, p. 90.
"A Low Power Multiplier Using Adiabatic Charging Binary Decision Diagram Circuit", *Extended Abstracts of the 1999 International Conference on Solid State Devices and Materials*, Tokyo, 1999, pp. 444–445.
Svensson et al., "Low Power Circuit Techniques", *Low Power Design Methodologies*, Kluwer Academic Publishers, 1996, Chapter 3, pp. 37–52.

* cited by examiner

*Primary Examiner*—Timothy P. Callahan
*Assistant Examiner*—Cassandra Cox
(74) *Attorney, Agent, or Firm*—Armstrong, Kratz, Quintos, Hanson & Brooks, LLP

(57) ABSTRACT

An adiabatic charging register circuit including a plurality of n-channel MOSFET's and plurality of p-channel MOSFET's, is operated by a clock signal which has a gradually rising and an gradually falling waveform generated by using a charge recycle power source in which charge supplied to a load is at lease partially collected to said charge recycle power source, and following inequality is satisfied;

$$|V_{TN}|+|V_{TP}| \geq VDD$$

wherein $V_{TN}$ is threshold of an n-channel MOSFET, $V_{TP}$ is threshold of a p-channel MOSFET, and VDD is output voltage of said charge recycle power source.

1 Claim, 18 Drawing Sheets

US 6,788,121 B2

ADIABATIC CHARGING REGISTER CIRCUIT

BACKGROUND OF THE INVENTION

1. Field of the Invention

The present invention relates to an adiabatic charging register circuit and, in particular, relates to such a circuit which reduces power consumption associated with a clock pulse.

2. Description of the Related Art

Conventionally, an LSI circuit includes a large number of register circuits, fifty thousand or more circuits. Each register circuit comprises a D-flip flop (D-FF) or D-latch circuit. A register circuit having a D-FF or D-latch is exemplified here.

First, a register circuit having a D-FF is described.

A D-FF has a pair of D-latch circuits. FIG. 17 shows an example of a D-latch circuit (page 677, "Structure and Design of a Computer", by David A. Patterson and John L. Hennessy, published by NikkeiBP). A D-latch circuit 70 in FIG. 17 has a pair of NOR circuits 71 and 72 which are cross-connected to each other constituting a RS-FF (reset-set-flip-flop), and a pair of AND circuits 73 and 74. It has data input terminals D, DN in differential form, a clock input terminal CK, and data output terminals Q, QN in differential form. Each of NOR circuits 71 and 72 operates as an inverter when one of the inputs of the same is in low state, and therefore, a D-latch circuit 70 in FIG. 17 operates as follows.

(1) A pair of NOR circuits 71, 72 keep a previous state when a clock input terminal CK is in low state.

(2) A value of a data input terminal D is stored in a pair of NOR circuits 71, 72 when a clock input terminal CK is in high state.

A D-FF circuit 80 is constituted by using a pair of D-latch circuits 70 as shown in FIG. 18, in which a first stage D-latch circuit 70A receives a clock input CK as it is, and a second stage D-latch circuit 70B receives a clock signal which is inversion by 180° of the clock input CK by an inverter 90. A D-FF circuit operates as follows.

(1) When a clock input CK becomes a high state, the first stage D-latch circuit 70A opens to accept a data D at an input terminal, (2) When a clock input CK becomes a low state, the second stage D-latch circuit 70B opens and an input terminal D accepts an output O1 on an output terminal Q of the first stage D-latch 70A, as an input signal D.

FIG. 19 shows operational wave forms of a data D, a clock input CK, an output O1 of the first stage D-latch circuit 70A, and an output O2 of the second stage D-latch circuit 70B. As shown in FIG. 19, the output O2 is switched by an input data when a clock input CK is switched from high state to low state, thus, it is an edge trigger type circuit.

Conventionally, a clock signal CK is generated by using an inverter having a CMOS circuit which has a p-channel MOSFET and an n-channel MOSFET connected in series with each other, and has rectangular wave form. A load coupled with an output of a clock signal generator is charged to power supply voltage VDD through p-channel MOSFET of an inverter when an output signal is in high state, and is discharged to ground through n-channel MOSFET of an inverter when an output signal is in a low state. Therefore, the power consumption P by a clock signal is $P = CV^2 f$, where f is the clock frequency, V is the power supply voltage, and C is the sum of capacitance of wires and gate capacitance which accept a clock signal.

The capacitance of wires is recently large because of an increase of semiconductor chip area of an integrated circuit reflecting a large scale integrated circuit, and therefore, power consumption by charge/discharge of a clock signal occupies almost 50% of the total power consumption of a semiconductor chip (page 90, Technical Report of Low Power LSI, Nikkei Micro-device, NikkeiBP).

Further, a large number of register circuits are used for a pipeline processing in an LSI for processing a moving image, and a RISC processor. In those devices, it is also known that power consumption by a clock system is almost the same as that by a logic system (page 8, Low power and high speed LSI technology, Realize Co.). That relation is independent from operation speed, but depends upon the ratio occupied by a register circuit in an LSI.

SUMMARY OF THE INVENTION

It is an object, therefore, of the present invention to provide a new and improved register circuit by overcoming the disadvantages and limitations of a prior register circuit.

It is also an object of the present invention to provide a register circuit which consumes less power in a clock system.

It is further an object of the present invention to provide a register circuit in which no short-circuit current from a power source to ground directly flows.

The above and other objects are attained by an adiabatic register circuit comprising; a plurality of n-channel MOSFET transistors and a plurality of p-channel MOSFET transistors, accepting an input data, and a clock signal, and providing an output data; said clock signal being a power clock signal having a gradually rising and gradually falling waveform generated by using a charge recycle power source in which power supplied to a load is at least partially collected and returned to said charge recycle power source; and following inequality is satisfied;

$$|V_{TN}| + |V_{TP}| \geq VDD$$

where $V_{TN}$ is threshold of said n-channel MOSFET transistor, $V_{TP}$ is threshold of said p-channel MOSFET, and VDD is output voltage of said charge recycle power source.

Preferably, said register circuit comprises a pair of D-latch circuits with an input of a second D-latch circuit coupled with an output of a first D-latch circuit, a first D-latch circuit accepts a first power clock signal, and a second D-latch circuit accepts a second power clock signal which is different by 180° of the first power clock signal.

Preferably, said D-latch circuit comprises a pair of NOR circuits with one of the inputs of each NOR circuit being coupled with an output of the other NOR circuit, and a pair of AND circuits each accepting an input data in differential form and a power clock signal, and providing an output to the other input of each of said NOR circuit.

Preferably, said register circuit includes a combination logic circuit between said pair of D-latch circuits.

Preferably, said D-latch circuit comprises a memory element having a first inverter providing an output of the D-latch circuit, a second inverter with an input coupled with an output of said first inverter, and a first transmission gate connecting an output of the second inverter to an input of the first inverter, and a second transmission gate inserted between an input terminal and an input of said first inverter.

BRIEF DESCRIPTION OF THE DRAWINGS

The foregoing and other objects, features, and attendant advantages of the present invention will be appreciated as the same become better understood by means of the following description and drawings wherein.

DESCRIPTION OF THE PREFERRED EMBODIMENTS

According to the present invention, a clock signal is a charge recycle type power clock generated by using a charge recycle power source, and having a gradually rising and gradually falling waveform, while a conventional clock signal use a rectangular clock signal. A register circuit using such a power clock signal has the advantage that power consumption in a clock system is considerably reduced as compared with that of a prior art, for instance, it is reduced to $1/10$ of that of a prior art. Further, when an n-channel MOSFET and a p-channel MOSFET which constitute a register circuit satisfy the following condition, no short-circuit current from a power source to ground is allowed;

$$|V_{TN}|+|V_{TP}| \geq VDD$$

where $V_{TN}$ is threshold of an n-channel MOSFET, $V_{TP}$ is threshold of a p-channel MOSFET, VDD is output voltage of a power source.

First Embodiment

Figure 1:
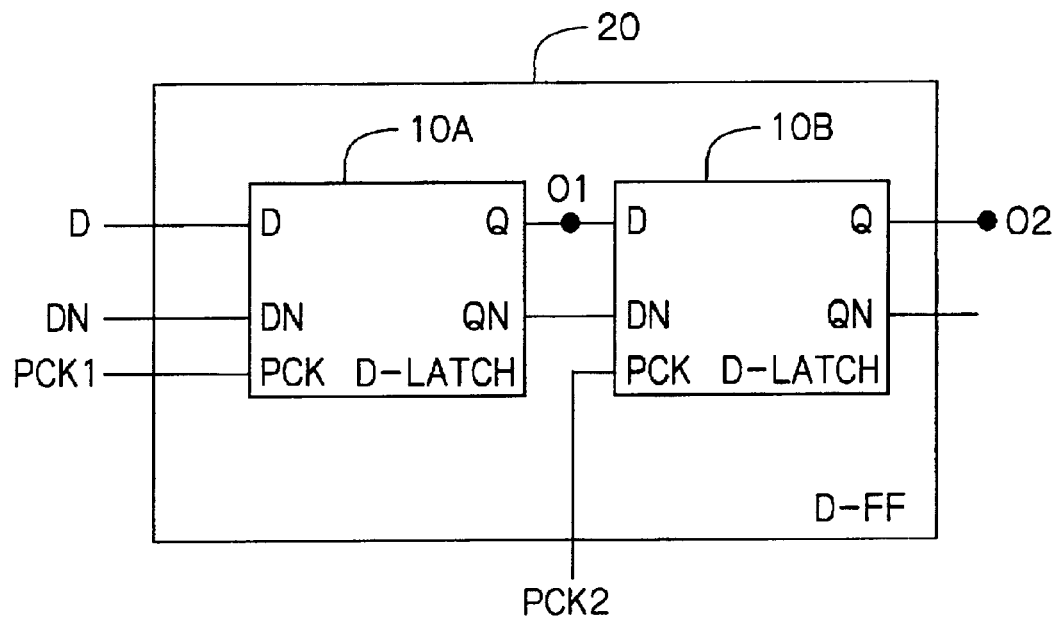
FIG. 1 is a block diagram of a D-FF circuit according to the present invention.

FIG. 1 is a block diagram of a D-FF circuit 20 which is a first embodiment of the present invention. The D-FF circuit 20 comprises a first stage D-latch circuit 10A, and a second stage D-latch circuit 10B. Each of the D-latch circuits 10A and 10B is shown in FIG. 2A by the reference numeral 10, which comprises a pair of NOR gates 11 and 12 conforming an RS-FF, and a pair of AND gates 13 and 14.

Figure 2A:
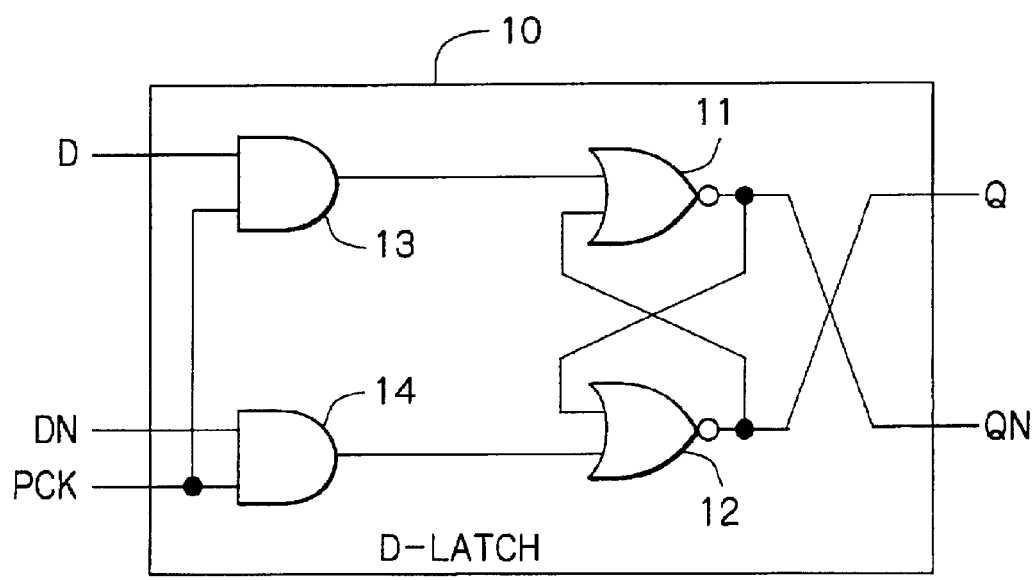
FIG. 2A is a circuit diagram of a D-latch circuit used in the D-FF circuit in FIG. 1.
Figure 2B:
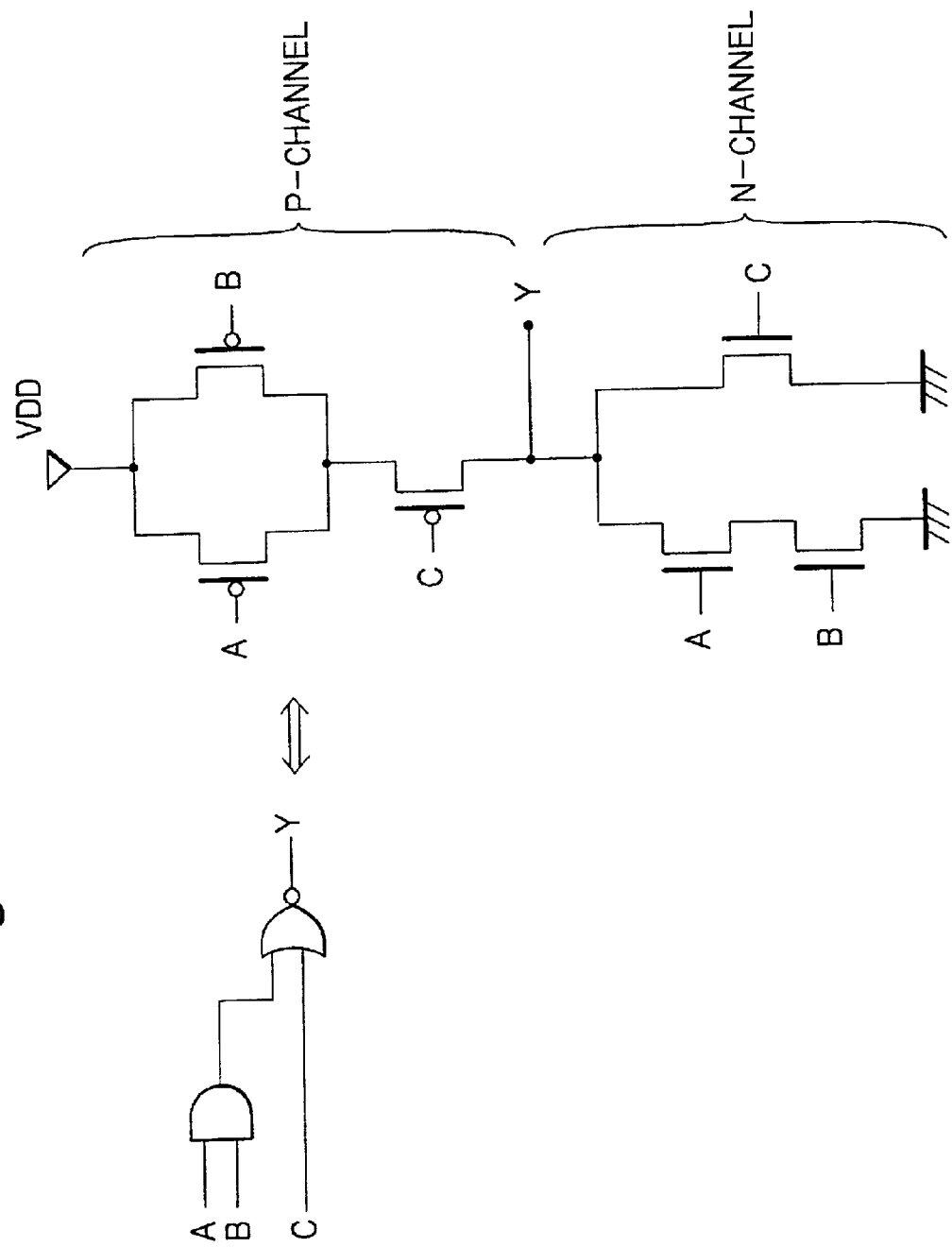
FIG. 2B shows a transistor circuit of a D-latch circuit in FIG. 2A.

The circuit of FIG. 2A is implemented by a CMOS including a p-channel MOSFET and an n-channel MOSFET, as shown in FIG. 2B, in which an AND circuit and a NOR circuit are implemented by three p-channel MOSFET's and three n-channel MOSFET's, as shown in the figure. Thus, the structure of FIG. 2A is implemented by using two sets of a circuit of FIG. 2B.

Figure 2C:
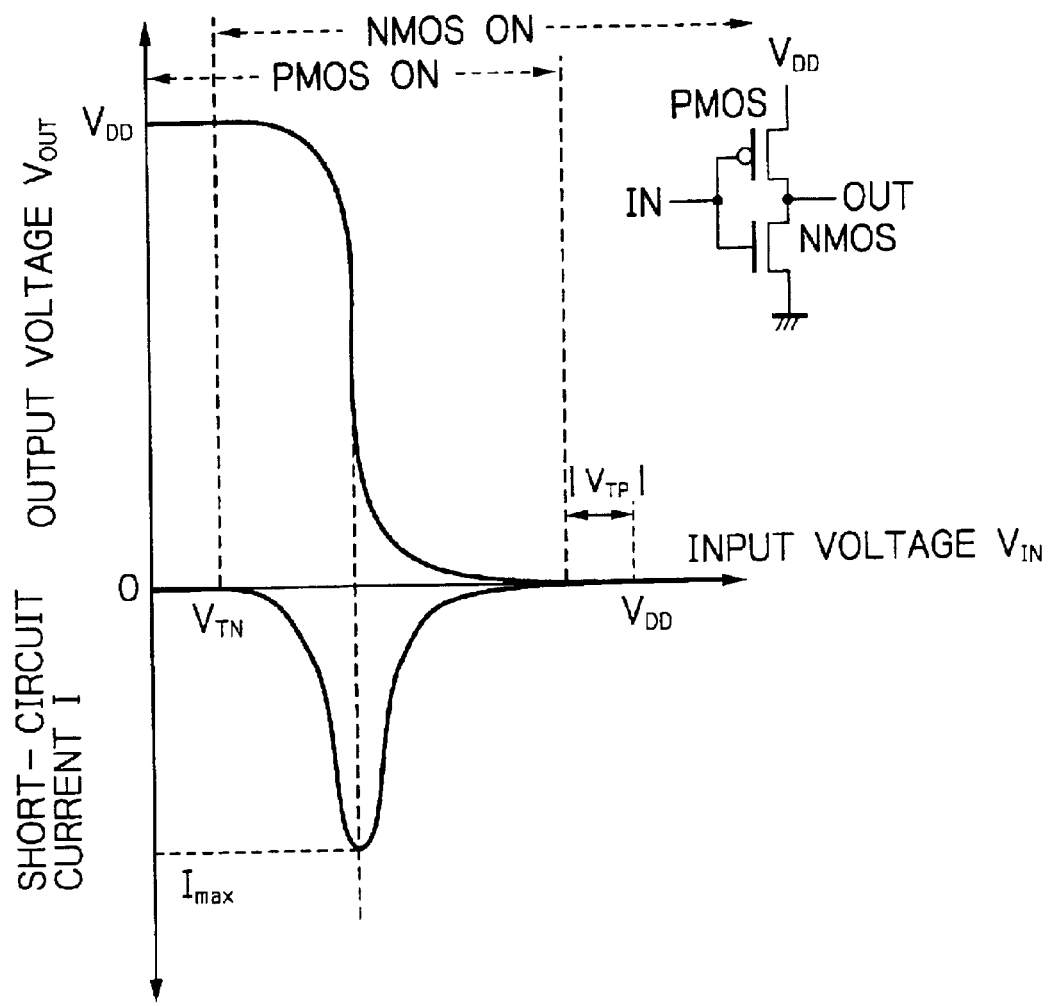
FIG. 2C shows operation of a conventional CMOS inverter.

Now, a short-circuit current flowing from a power source VDD to ground directly in a CMOS circuit is analyzed in accordance with FIG. 2C. In an inverter having a series circuit of a p-channel MOSFET and an n-channel MOSFET between a power source VDD and a ground, a short-circuit current from a power source VDD to ground flows during a transient time of an input signal. As a power clock rises and falls slowly, a short-circuit current during a transient time would be greater than that of the prior art which uses a rectangular clock. The upper portion of FIG. 2C shows the relation between an input voltage IN and an output voltage OUT, and the lower portion of FIG. 2C shows the relation between an input voltage IN and a short-circuit current. The maximum short-circuit current Imax is:

$$\text{Imax}=(\beta_n/2)((VDD-|V_{TN}|-|V_{TP}|)/(1+\sqrt{\beta_n/\beta_p}))^2$$

$$VDD > |V_{TN}|+|V_{TP}|$$

Imax=0

$$VDD \; |V_{TN}|+|V_{TP}|$$

where $\beta_n = \mu_n \, \text{Cox}(W/L)$ $\mu_n$ is mobility

W is channel width of a MOSFET

L is channel length of a MOSFET

Cox is oxide capacitance per unit area

Therefore, a short-circuit current from a power source to ground is zero, even if a gradually rising and gradually falling power clock is used, when VDD $|V_{TN}|+|V_{TP}|$ is satisfied.

According to the present invention, a threshold value $V_{TN}$ of an n-channel MOSFET and a threshold value $V_{TP}$ of a p-channel MOSFET is designed high so that the following inequality is satisfied;

$$|V_{TN}|+|V_{TP}| \geq VDD$$

where $V_{TN}$ is a threshold of an n-channel MOSFET used in NOR gates 11 and 12, and AND gates 13 and 14, $V_{TP}$ is a threshold of a p-channel MOSFET used in NOR gates 11 and 12, and AND gates 13 and 14, and VDD is power source voltage. That condition allows no short-circuit current from a power source to ground of a logic gate in a D-latch circuit 10.

Further, according to the present invention, a clock input terminal PCK of a first stage D-latch circuit 10A in a D-FF 20 receives a first power clock PCK1 which is generated by a charge recycle type power source, and has a wave-form which rises and falls slowly or gradually, and a clock input terminal PCK of a second stage D-latch circuit 10B in a D-FF 20 receives a second power clock PCK2 which is different in phase by 180° of that of the first power clock PCK1.

Figure 3:
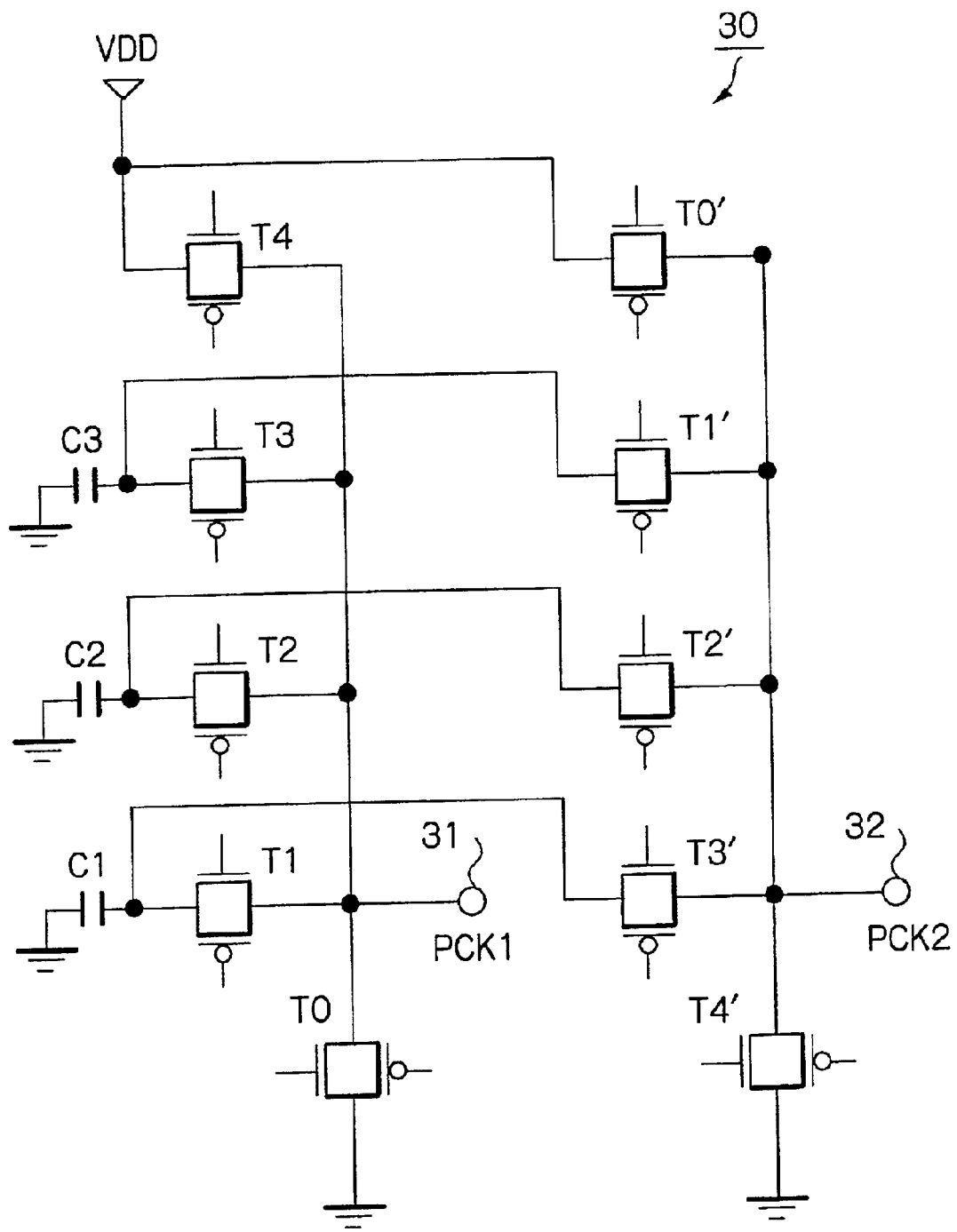
FIG. 3 is a circuit diagram of a gradually rising and gradually falling waveform generator.

The power clocks PCK1 and PCK2 may be generated by using a gradually rising and gradually falling waveform generator 30 constituted by a switched capacitor circuit as shown in FIG. 3 ("A Low Power Multiplier Using Adiabatic Charging Binary Decision Diagram Circuit", Shunji Nakata, Takakuni Douseki, and Yuichi Kado, 1999 International Conference on Solid State Devices and Materials, Tokyo, 1999, pp. 444–445), or an LC resonance circuit (not shown). In FIG. 3, T0–T4, T0'–T4' are a transmission gate, C1–C3 are a capacitor. A gradually rising and gradually falling waveform generator 30 provides a pair of power clocks PCK1 and PCK2 each having a gradually rising and gradually falling waveform by conducting a pair of transmission gates sequentially in the following sequence.

(T0,T0')→(T1,T1')→(T2,T2')→(T3,T3')→(T4,T4')

→(T3,T3')→(T2,T2')→(T1,T1')→(T0,T0')→(T1,T1')→

Figure 4:
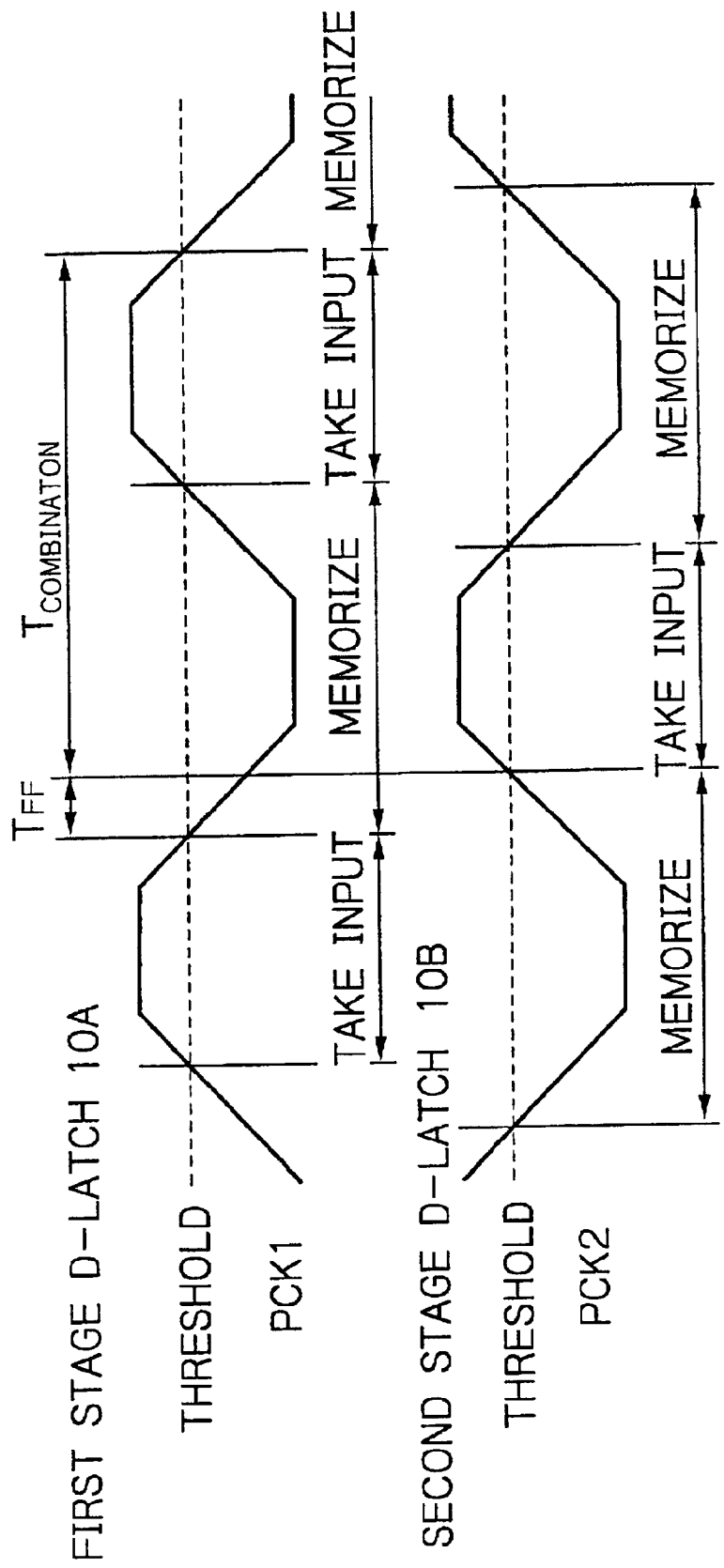
FIG. 4 shows waveforms of a power clock used in a D-FF circuit in FIG. 1.

Assuming that VDD=1V, $|V_{TN}|=|V_{TP}|=0.7V$, the operation of the first stage D-latch circuit 10A and the second stage D-latch circuit 10B is shown in FIG. 4. When the amplitude of the power clocks PCK1 and PCK2 is greater than 0.7V, the D-latch circuit 10A or 10B accepts an input data, and keeps the previous status when the amplitude of the power clocks PCK1 and PCK2 is less than 0.7V.

Figure 5:
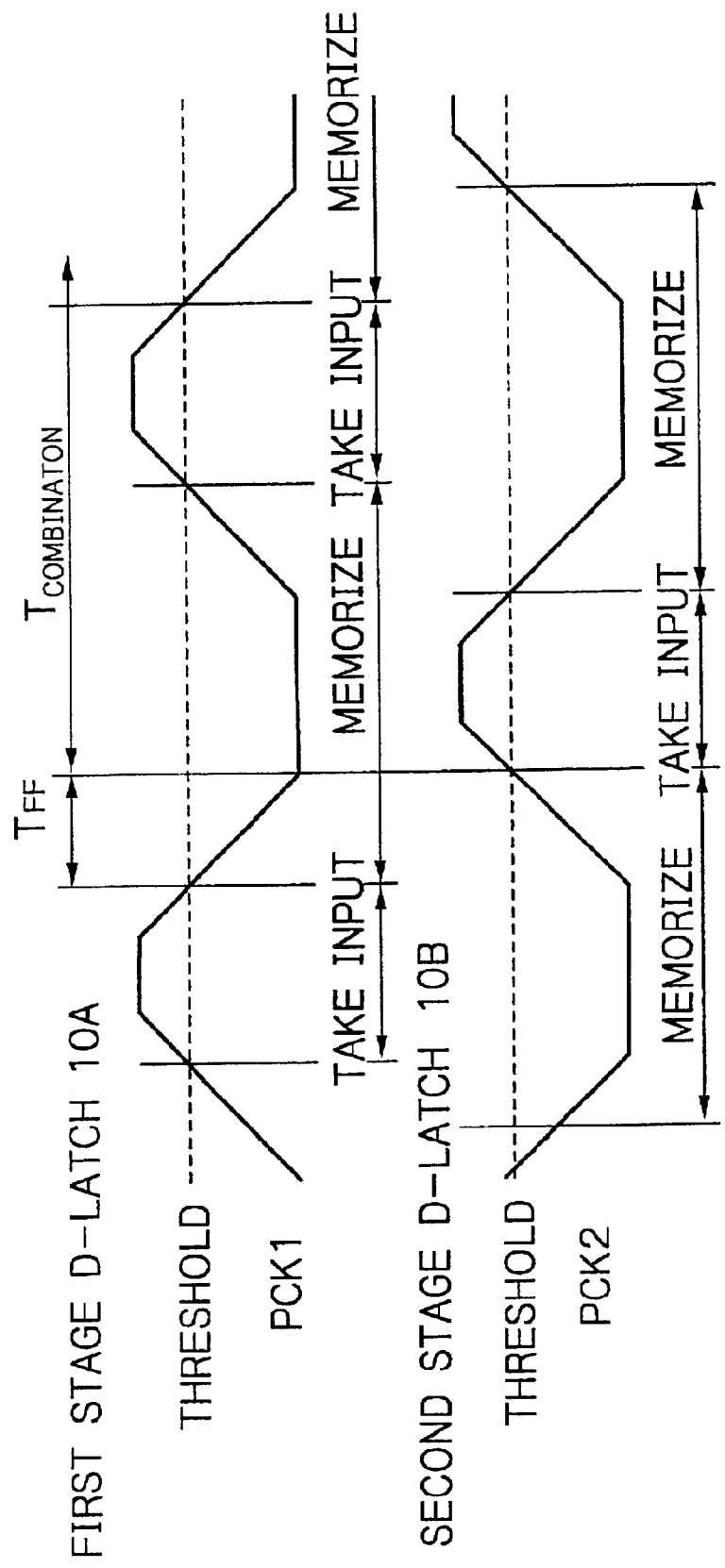
FIG. 5 shows waveforms of another power clock used in a D-FF circuit in FIG. 1.
Figure 6:
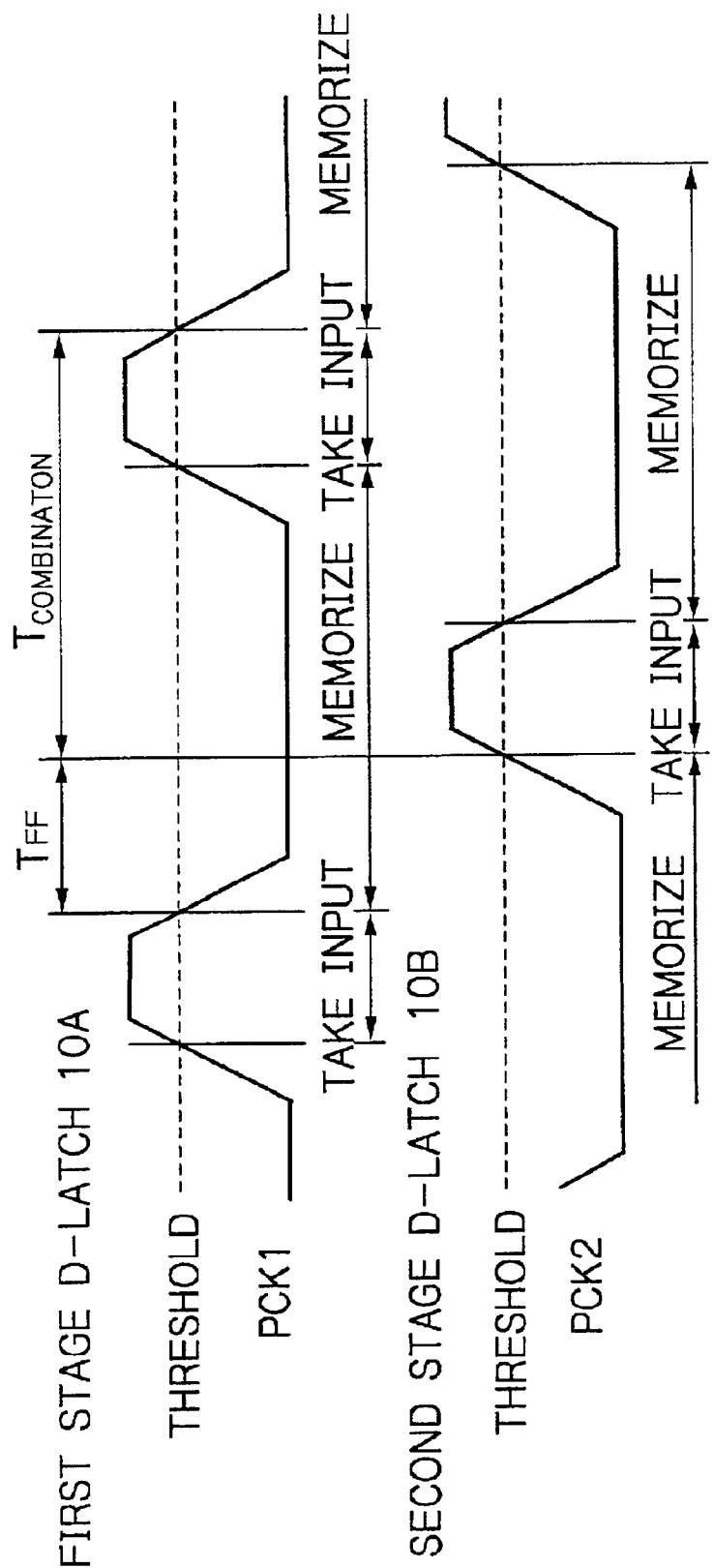
FIG. 6 shows waveforms of still another power clock used in a D-FF circuit in FIG. 1.

FIGS. 5 and 6 show wave-forms of power clocks PCK1 and PCK2 having different duty ratios.

In those figures, the period $T_{FF}$ shows the time from data input to data output in a D-FF circuit 20, and the period Tcombination shows the allowable delay time allowed to a combination logic circuit coupled with an output or an input of a D-FF circuit 20.

A D-FF circuit driven by power clocks PCK1 and PCK2 is called an adiabatic charging D-FF circuit, because the power consumption of power clocks is not consumed but is returned to a power supply. The adiabatic charging D-FF circuit has the following features.

(1) It has cross-wired NOR gates in static operation which is stable as compared with dynamic operation. Static operation has an output equal to VDD or 0, while dynamic operation has not only an output of VDD or 0, but also an open output which is not VDD nor 0.

(2) No data goes directly from input to output of a D-FF circuit, because a first stage D-latch 10A and a second stage D-latch 10B do not take data simultaneously.

(3) Both D-latch circuits 10A and 10B have a period of storage mode simultaneously. In that case, each D-latch circuit 10A and 10B stores data independently.

(4) The time $T_{FF}$ is larger than $T_{FF}$ of a prior D-FF circuit.

(5) The power consumption is less than 1/10 of that using a conventional rectangular clock signal, because power clocks PCK1 and PCK2 are used.

(6) It is compatible with a prior art D-FF. In other words, a conventional D-FF circuit constituted by a CMOS circuit using a rectangular clock signal can be substituted with an adiabatic charging D-FF circuit using a charge recycle type power source.

Figure 7:
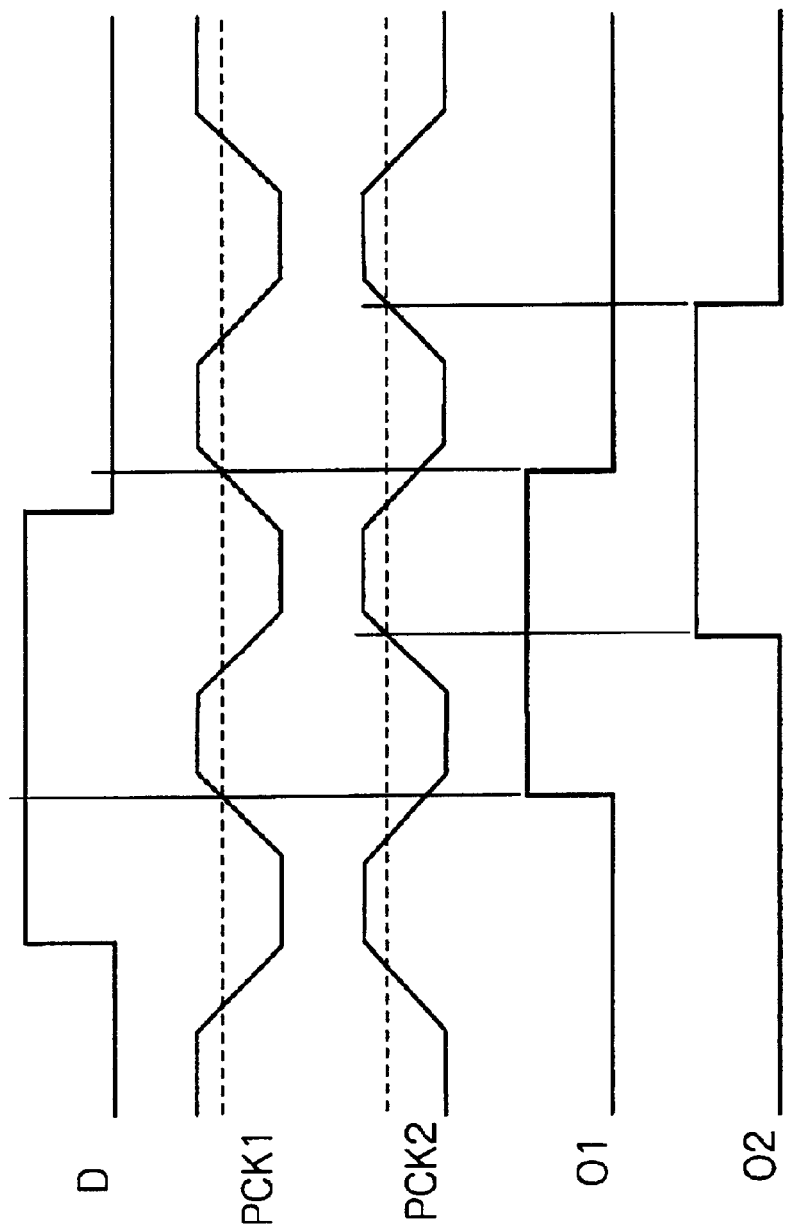
FIG. 7 shows operational waveforms of a D-FF circuit in FIG. 1.

FIG. 7 shows the operation of an adiabatic charging D-FF circuit of FIG. 1. It is noted that an input data D is taken when a power clock PCK1 changes from high to low, and the data thus taken is kept for a period of the PCK2 (see an output wave form O2).

Figure 8:
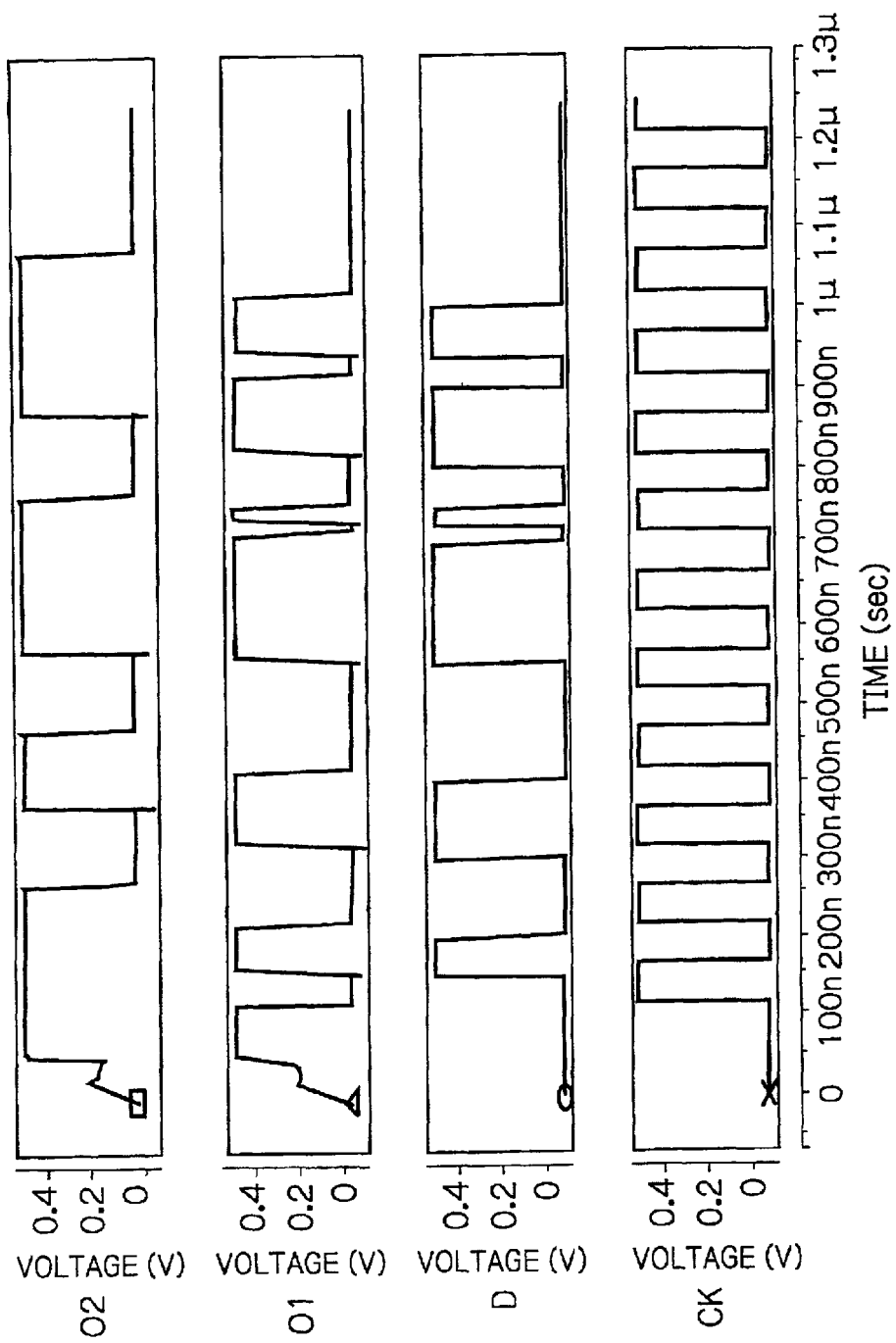
FIG. 8 shows simulation result of a D-FF circuit using a conventional rectangular clock.
Figure 9:
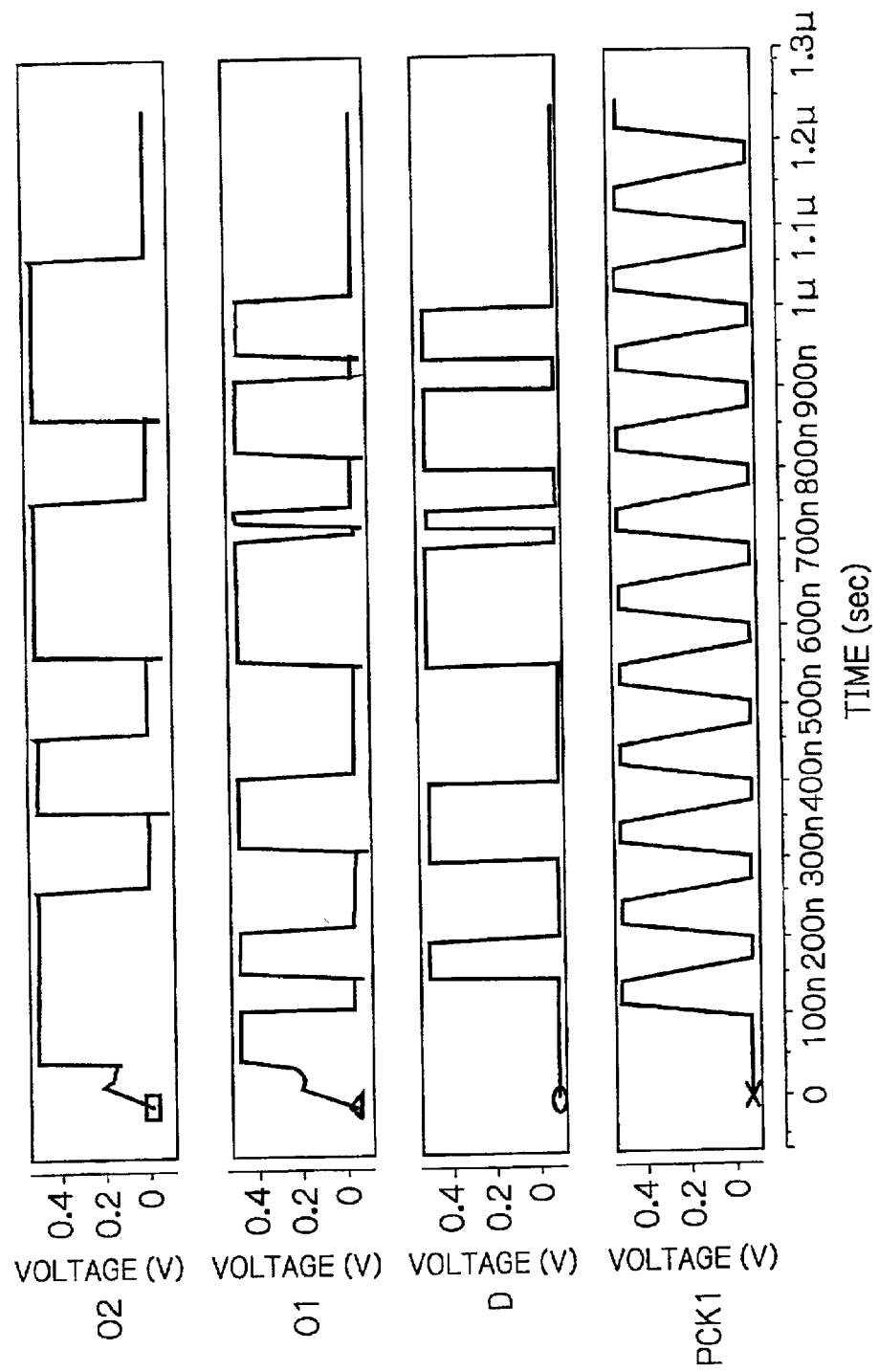
FIG. 9 shows simulation result of a D-FF circuit using the present power clock.
Figure 18:
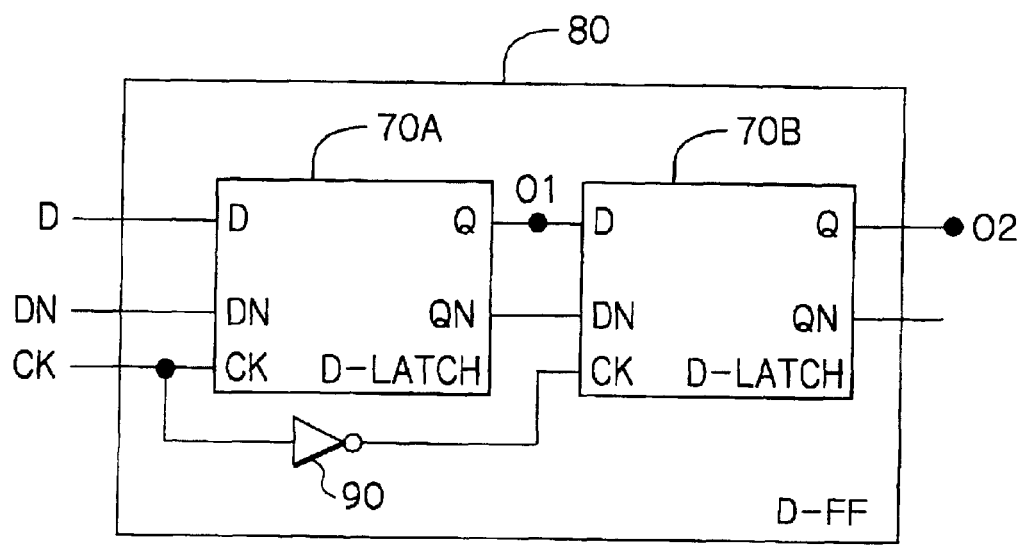
FIG. 18 is a prior D-FF circuit.
Figure 19:
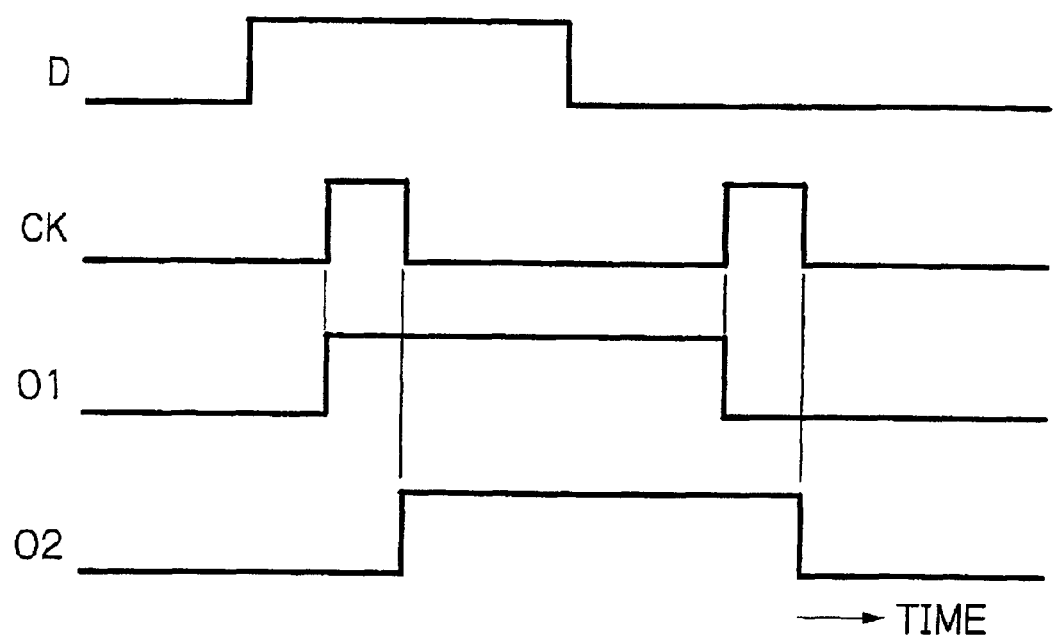
FIG. 19 shows operational waveforms of a D-FF circuit in FIG. 18.

FIGS. 8 and 9 show the simulation result using a simulation software HSPICE. FIG. 8 shows the result of a conventional D-FF 80 in FIG. 18 when a conventional rectangular clock CK is used, and FIG. 9 shows the result of the present D-FF 20 in FIG. 1 when the present power clocks PCK1 and PCK2 are used. The power clock PCK2 is not shown because it is the same as PCK1 but different in phase by 180°. In the simulation, it is assumed that the gate length of an n-channel MOSFET and a P-channel MOSFET is 0.25 μm, the gate width of a p-channel MOSFET is 9 μm, the gate width of an n-channel MOSFET is 6 μm, the threshold is $|V_{TN}|=|V_{TP}|=0.3V$, the power supply voltage is VDD=0.5 V, and the period of a clock signal (PCK1, PCK2, CK) is 100 nS (f=10 MHz).

The simulation result shows that outputs of a D-FF circuit when PCK1 and PCK2 are used are the same as those when a conventional clock CK is used.

The power consumption by a D-FF circuit with a constant power supply voltage is 320 nW in both a conventional D-FF circuit using a CMOS, and the present adiabatic charging type D-FF circuit. No increase in power consumption by a short-circuit current occurs as no short-circuit current flows. The power consumption by a conventional rectangular clock signal CK is 310 nW, while the power consumption by the present power clock signals PCK1 and PCK2 is only 23 nW. Thus, power consumption by the adiabatic power clock signals is less than 1/10 that of a conventional clock signal.

Figure 10:
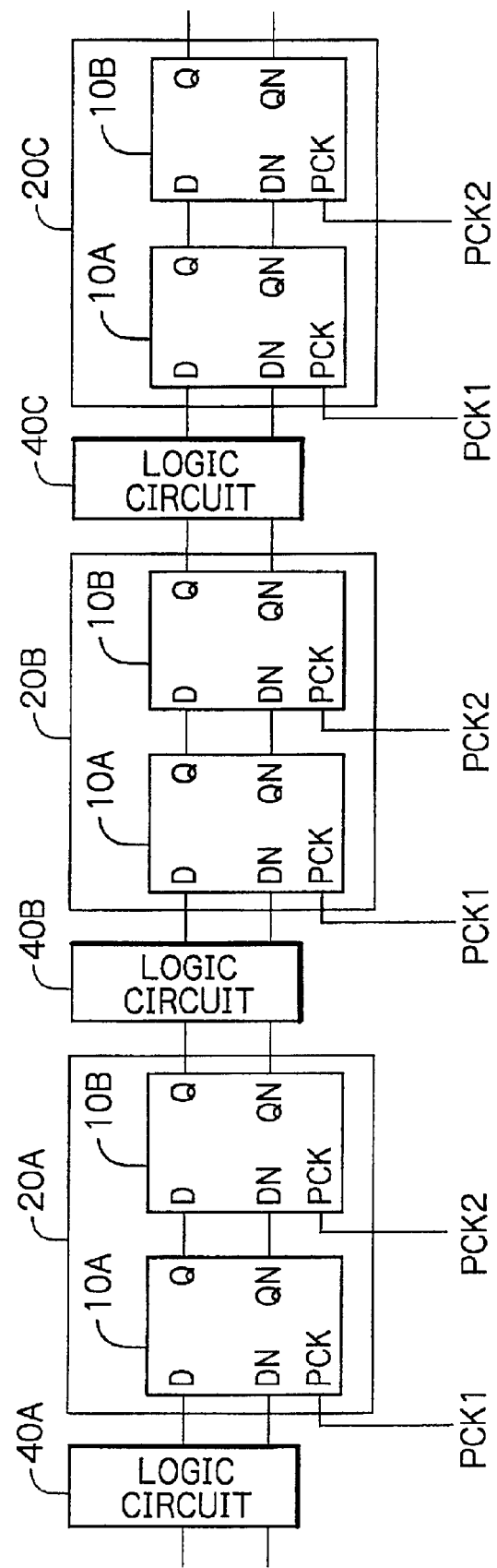
FIG. 10 is a block diagram of a logic system having an alternate arrangement of a D-FF circuit in FIG. 1 and a logic circuit.

FIG. 10 shows a logic system having an alternate arrangement of a D-FF circuit 20A through 20C of the D-FF circuit 20 in FIG. 1, and combination logic circuit 40A through 40C. It should be noted that the process time in a logic circuit 40A through 40C is less than said Tcombination.

Second Embodiment

Figure 11:
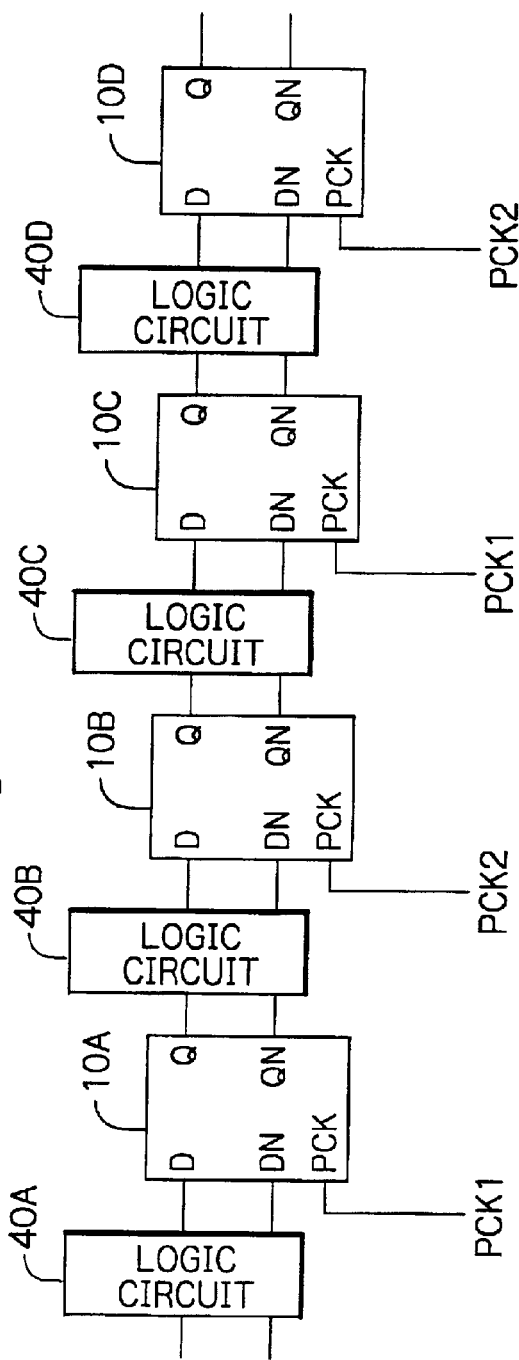
FIG. 11 is a block diagram of another logic system having an alternate arrangement of a D-latch circuit in FIG. 1 and a logic circuit.

FIG. 11 shows a second embodiment according to the present invention. The feature of FIG. 11 is an alternate arrangement of a D-latch circuit 10A through 10D of the D-latch circuit in FIG. 2 and a combination logic circuit 40A through 40D. No concept of the time $T_{FF}$ exists in this embodiment, and the allowable delay time allowed to each combination logic circuit 40A through 40D is the same as the allowed time between latch circuits using a conventional rectangular clock signal.

Figure 12:
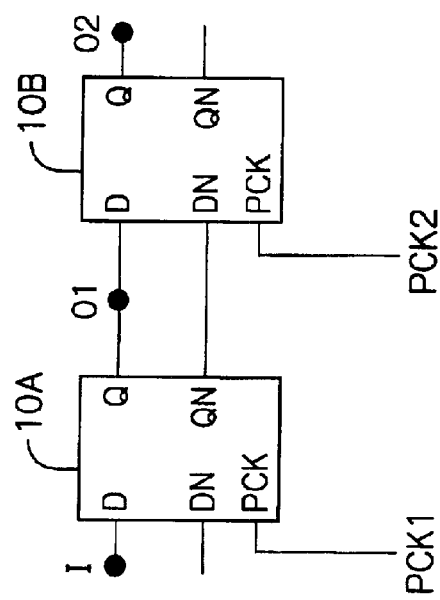
FIG. 12 is a modification of FIG. 11, and shows a pair of D-latch circuits coupled directly with no logic circuit between them.
Figure 13:
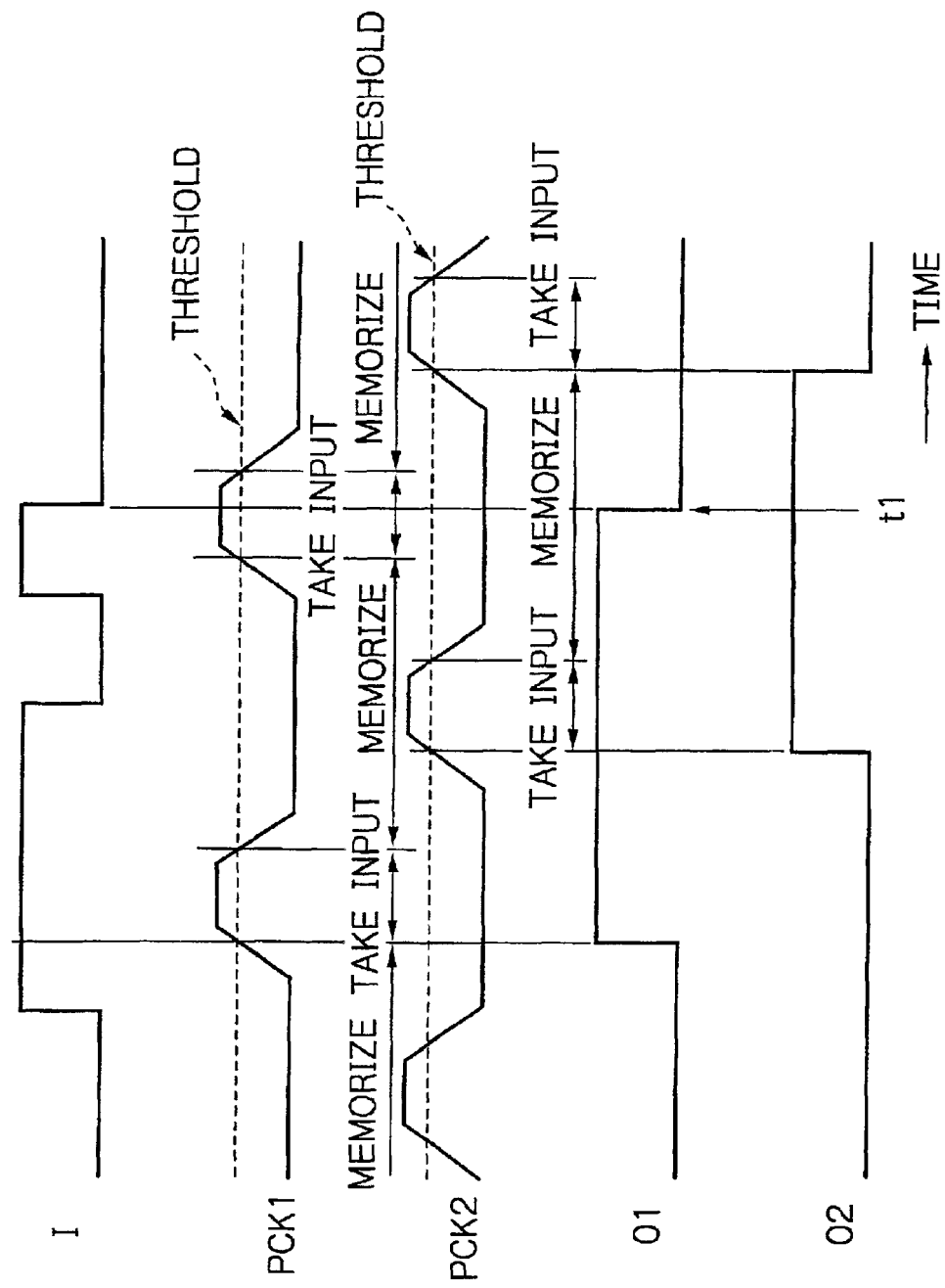
FIG. 13 shows operational waveforms of a circuit of FIG. 12.

FIG. 12 is a modification of FIG. 11. In FIG. 12, a pair of D-latch circuits 10A and 10B are coupled directly together with no combination logic circuit between the D-latch circuits, and the operational wave forms of FIG. 12 are shown in FIG. 13, which are almost the same as those of FIG. 7 which shows the operation of FIG. 1, except that an input data I is slightly modified so that an input data I changes from high to low at time t1 when a power clock PCK1 is higher than the threshold value, and the wave form of the input signal I appears in an output O1.

Third Embodiment

Figure 14:
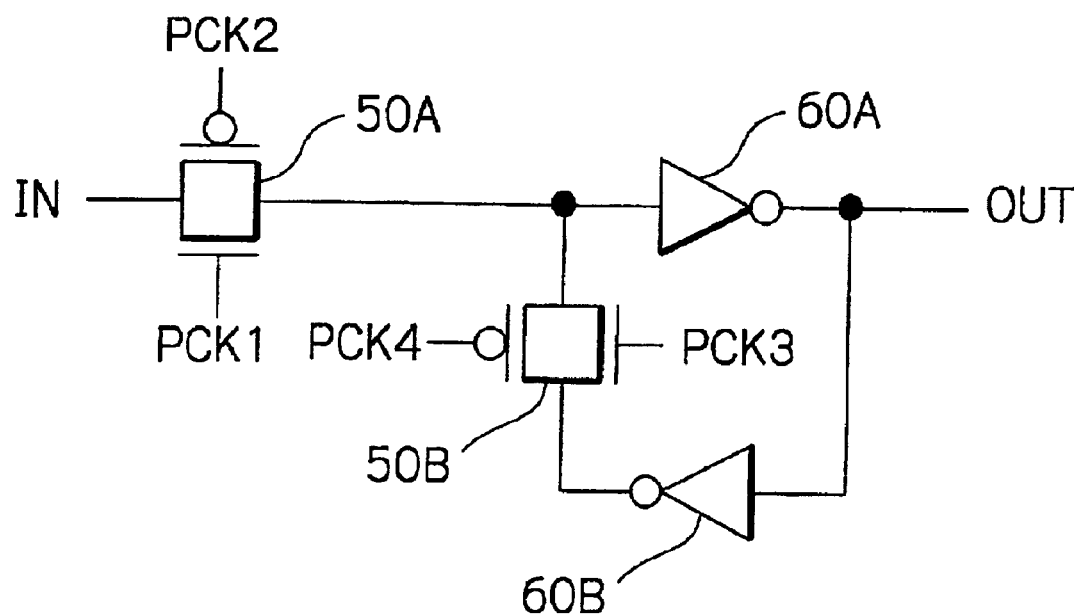
FIG. 14 is another embodiment of a D-latch circuit using a transmission gate.

FIG. 14 shows a third embodiment according to the present invention. In this embodiment, a latch circuit is comprised of a memory circuit having a pair of inverters 60A and 60B, and a transmission gate 50B, and another transmission gate 50A connected to an input side of the transmission gate 50B. Four power clocks PCK1, PCK2, PCK3 and PCK4 are used. PCK1 and PCK2 are applied to the transmission gate 50A, and have the opposite relations with each other. PCK3 and PCK4 are applied to the transmission gate 50B, and have the opposite relations with each other. PCK1 and PCK2 are shifted by 180° from PCK3 and PCK4, respectively.

Figure 15:
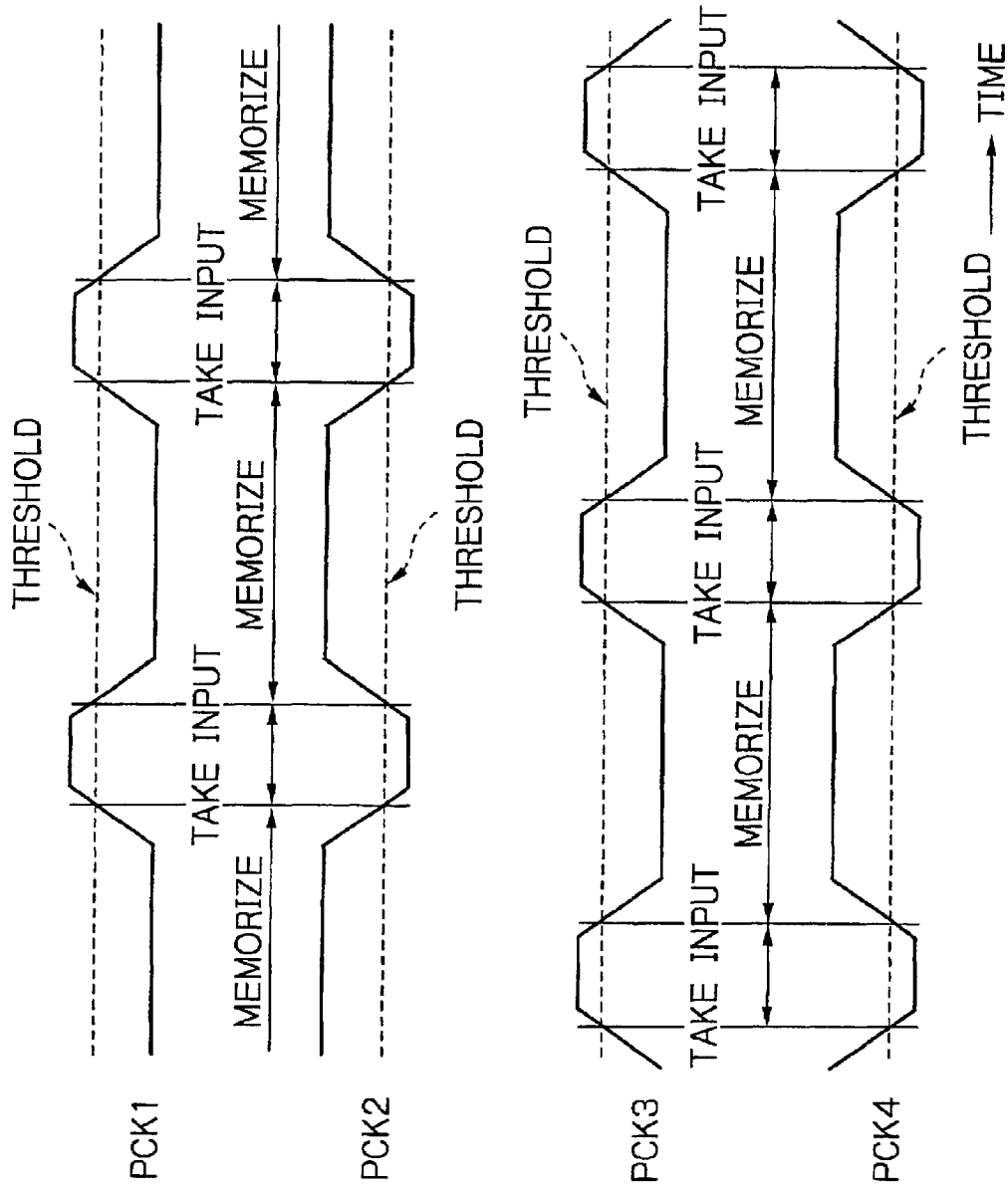
FIG. 15 shows waveforms of a power clock used in a circuit of FIG. 14.

FIG. 15 shows wave forms of power clocks PCK1 through PCK4.

Consideration of a D-latch Circuit

Two kinds of D-latch circuits are possible, one is an RS-FF type as shown in FIG. 2, and the other is a transmission gate type as shown in FIG. 14.

An RS-FF type takes static operation for input and storage of a data, and operates correctly even for slow speed operation. On the other hand, a transmission gate type circuit operates dynamically, and is not suitable for very slow speed operation.

As for a number of transistors which receive a clock signal, an RS-FF type circuit has four transistors (two transistors in each AND gate), and a transmission gate type circuit has six transistors (each transmission gate has two transistors and two transistors are used for inverting a clock signal. There are two transmission gates 50A and 50B, thus, six transistors are required). Thus, an RS-FF type circuit requires a fewer number of transistors as far as a clock signal concerns, although an RS-FF type circuit requires a greater number of transistors than a transmission gate type circuit, and therefore, power consumption in an RS-FF type is smaller (C. Svensson and D. Liu, Low Power Design Methodologies, eds. J. M. Rabaey and M. Pedram (Kluwer Academic Publisheres, 1996, Chap. 3, page 37).

The choice of an RS-FF type circuit or a transmission gate type circuit as a adiabatic charging reversible logic circuit should be designed base upon an object of a circuit, considering above analysis.

The use in Sub-threshold Region

In a specific condition, the current adiabatic charging register circuit can operate in a weak inversion region with power supply voltage lower than threshold voltage (sub-threshold region; $|V_{TP}|$>VDD and $|V_{TN}|$>VDD), like a prior CMOS circuit. It can be applied to slow speed operation LSI in sub-threshold region such as an environment sensor, or a living body sensor.

Figure 16:
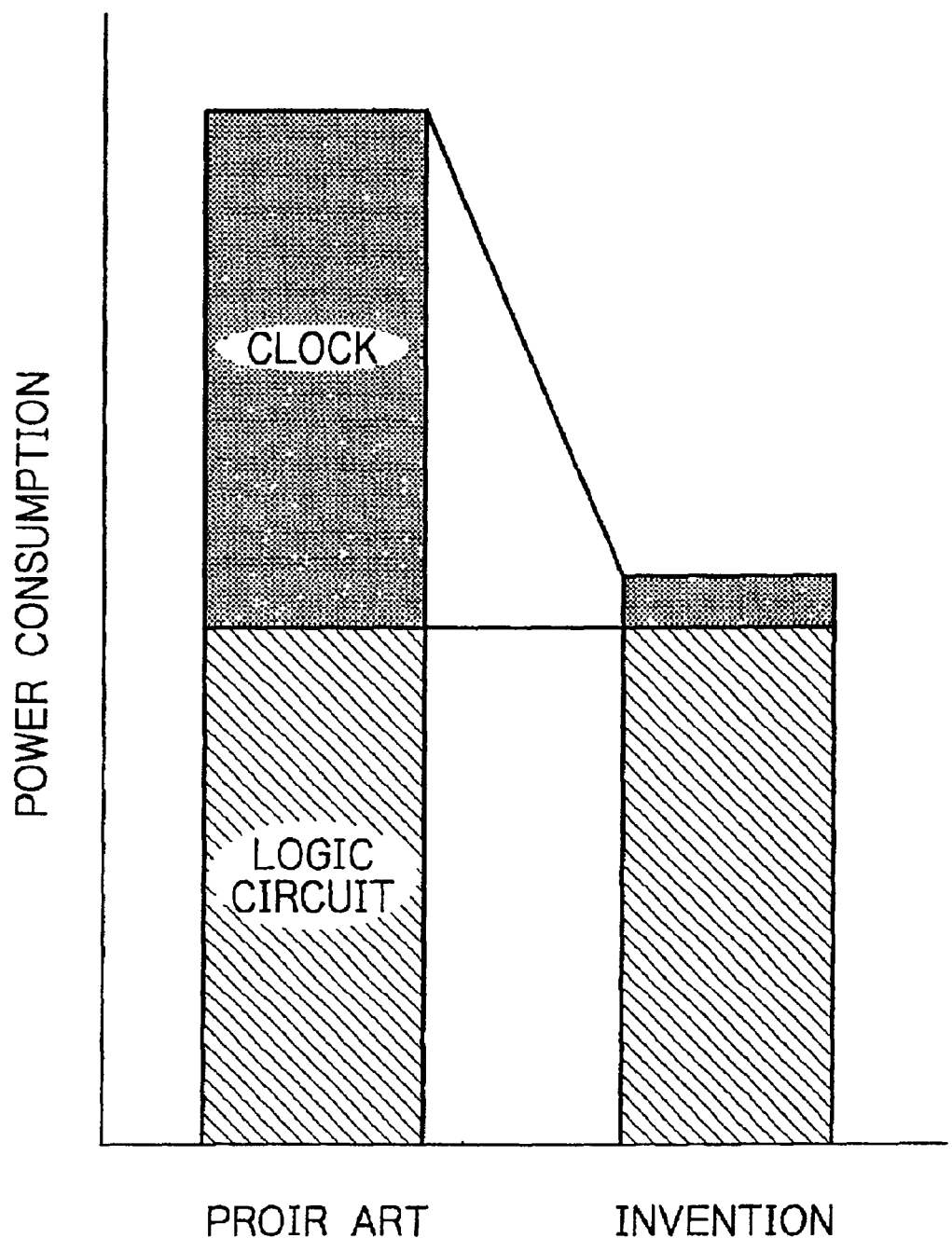
FIG. 16 shows the effect of the present invention.
Figure 17:
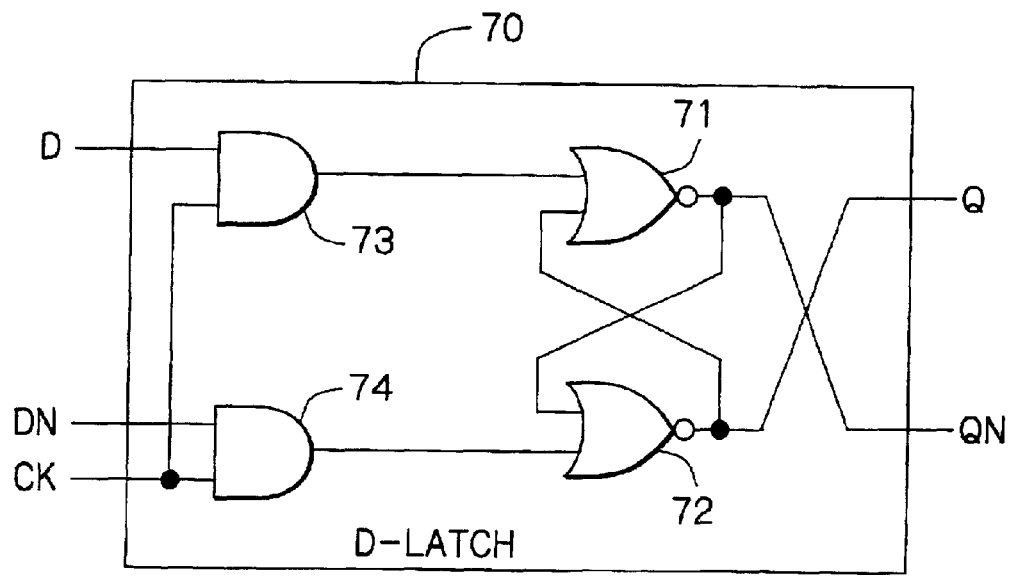
FIG. 17 is a prior D-latch circuit.

As described above, according to an adiabatic charging register circuit of the present invention, power consumption consumed in a clock system is reduced approximately $1/10$ of that of a conventional CMOS register circuit (FIG. 16). FIG. 16 shows that the power consumption by a clock signal and the power consumption of a logic circuit in the prior art are almost the same as each other, on the other hand, the power consumption by a clock signal in the present invention is only $1/10$ of that of the prior art. Therefore, although the power consumption by a logic circuit in the present invention is the same as that of the prior art, the total power consumption including a clock system and a logic circuit in the present invention is considerably less than that of the prior art.

Further, the present adiabatic charging register circuit is compatible with a conventional CMOS type register circuit. It is enough only to substitute an adiabatic charging type register circuit with a conventional CMOS type register circuit. Thus, the design of a circuit is quite simple.

From the foregoing, it should be appreciated that a new and improved adiabatic charging type register circuit has been found. It should be understood of course that the embodiments disclosed are merely illustrative and are not intended to limit the scope of the invention. Reference should be made to the appended claims, therefore, to indicate the scope of the invention.

What is claimed is:

1. A register circuit having a plurality of n-channel MOSFET transistors and a plurality of p-channel MOSFET transistors, accepting an input data, and a clock signal, and providing an output data, said clock signal being a charge recycled clock signal having a gradually rising and gradually falling non-rectangular waveform generated by using a charge recycle power source in which power supplied to a load is at least partially collected and returned to said charge recycle power source, and the following inequality is satisfied:

$$|V_{TN}|+|V_{TP}|>VDD$$

where $V_{TN}$ is a threshold of said n-channel MOSFET transistor, $V_{TP}$ is a threshold of said p-channel MOSFET, and VDD is an output voltage of said charge recycle power source, wherein said register circuit comprises a pair of D-latch circuits with an input of a second D-latch circuit coupled with an output of a first D-latch circuit, a first D-latch circuit accept a first power clock signal, and a second D-latch circuit accepts a second power clock signal which is different by 180° phase of the first power clock signal, and wherein said register circuit includes a combination logic circuit between said pair of D-latch circuit.

* * * * *